(12) United States Patent
Hoya

(10) Patent No.: US 11,727,975 B2
(45) Date of Patent: Aug. 15, 2023

(54) NONVOLATILE MEMORY DEVICE

(71) Applicant: Kioxia Corporation, Tokyo (JP)

(72) Inventor: Katsuhiko Hoya, Yokohama Kanagawa (JP)

(73) Assignee: Kioxia Corporation, Tokyo (JP)

( * ) Notice: Subject to any disclaimer, the term of this patent is extended or adjusted under 35 U.S.C. 154(b) by 45 days.

(21) Appl. No.: 17/475,822

(22) Filed: Sep. 15, 2021

(65) Prior Publication Data

US 2022/0284939 A1 Sep. 8, 2022

(30) Foreign Application Priority Data

Mar. 8, 2021 (JP) ................. 2021-036568

(51) Int. Cl.
*G11C 11/00* (2006.01)
*G11C 11/16* (2006.01)

(52) U.S. Cl.
CPC ...... *G11C 11/1675* (2013.01); *G11C 11/1659* (2013.01)

(58) Field of Classification Search
CPC ............ G11C 11/1675; G11C 11/1659; G11C 11/1655; G11C 11/1657; G11C 11/1673; G11C 16/0483; G11C 16/24
See application file for complete search history.

(56) References Cited

U.S. PATENT DOCUMENTS

| | | | |
|---|---|---|---|
| 6,882,565 B2 | 4/2005 | Tsuchida | |
| 8,482,969 B2 | 7/2013 | Hoya et al. | |
| 9,299,409 B2 | 3/2016 | Miyakawa et al. | |
| 9,368,199 B2 | 6/2016 | Miyakawa et al. | |
| 9,646,667 B2 | 5/2017 | Miyakawa et al. | |
| 9,704,918 B2 | 7/2017 | Miyakawa et al. | |
| 9,818,467 B2 | 11/2017 | Matsuoka et al. | |
| RE46,702 E | 2/2018 | Hoya et al. | |
| 10,783,946 B2 | 9/2020 | Miyakawa et al. | |
| 2014/0175679 A1* | 6/2014 | Kwon | H01L 23/49827 257/784 |
| 2014/0258767 A1* | 9/2014 | Park | G06F 11/14 713/503 |
| 2014/0355336 A1 | 12/2014 | Hoya | |
| 2016/0322101 A1 | 11/2016 | Sacchetto et al. | |

(Continued)

FOREIGN PATENT DOCUMENTS

JP 3836823 B2 10/2006

*Primary Examiner* — Hien N Nguyen
(74) *Attorney, Agent, or Firm* — Holtz, Holtz & Volek PC

(57) ABSTRACT

A nonvolatile memory device of an embodiment includes: a first wiring line extending in a first direction; a second wiring line extending in a second direction intersecting the first direction; a memory cell disposed between the first layer and the second layer, and has first and second terminals, the memory cell including a variable resistance element; a first drive circuit capable of supplying a first potential and a second potential lower than the first potential; a second drive circuit supplying a third potential having a different polarity from a polarity of the first potential; a third drive circuit capable of supplying the second potential and a fourth potential higher than the second potential; a fourth drive circuit supplying a fifth potential having a different polarity from a polarity of the first potential; and a control circuit electrically connected to the first to fourth drive circuits.

23 Claims, 12 Drawing Sheets

(56) References Cited

U.S. PATENT DOCUMENTS

| | | | |
|---|---|---|---|
| 2018/0158499 A1* | 6/2018 | Shimomura | G11C 11/1675 |
| 2019/0079575 A1* | 3/2019 | Hanson | G06F 1/3275 |
| 2019/0311748 A1* | 10/2019 | Rohleder | G11C 5/147 |
| 2020/0035305 A1 | 1/2020 | Choi et al. | |
| 2020/0090715 A1 | 3/2020 | Dodge et al. | |
| 2022/0293155 A1* | 9/2022 | Katayama | G11C 11/1673 |
| 2022/0301621 A1* | 9/2022 | Nakayama | G11C 11/1657 |

* cited by examiner

NONVOLATILE MEMORY DEVICE

CROSS REFERENCE TO RELATED APPLICATIONS

This application is based upon and claims the benefit of priority from the prior Japanese Patent Application No. 2021-036568, filed on Mar. 8, 2021, the entire contents of which are incorporated herein by reference.

FIELD

Embodiments of the present invention relate to nonvolatile memory devices.

BACKGROUND

A known nonvolatile memory device may be a magnetoresistive random access memory (MRAM) that includes memory cells each including a magnetic tunnel junction (MTJ) dement, for example. For such nonvolatile memory devices, an architecture having a three-dimensional structure is being considered. Normally, in a nonvolatile memory device having this architecture, a circuit (hereinafter also referred to as a circuit under array (CUA)) that drives memory cells is provided below a memory cell array in which the memory cells are arranged.

DETAILED DESCRIPTION

A nonvolatile memory device according to an embodiment includes: a first wiring line that is disposed in a first layer and extends in a first direction; a second wiring line that is disposed in a second layer above the first layer and extends in a second direction intersecting the first direction; a memory cell that is disposed in a third layer located between the first layer and the second layer, and has a first terminal electrically connected to the first wiring line and a second terminal electrically connected to the second wiring line, the memory cell including a variable resistance element having a resistance that varies when a write current flows from one of the first terminal and the second terminal to the other; a first drive circuit that is electrically connected to one end of the first wiring line, and is capable of supplying a first potential and a second potential lower than the first potential; a second drive circuit that is electrically connected to the other end of the first wiring line, and supplies a third potential having a different polarity from a polarity of the first potential; a third drive circuit that is electrically connected to one end of the second wiring line, and is capable of supplying the second potential and a fourth potential higher than the second potential; a fourth drive circuit that is electrically connected to the other end of the second wiring line, and supplies a fifth potential having a different polarity from a polarity of the first potential; and a control circuit that is electrically connected to the first to fourth drive circuits.

The following is a description of nonvolatile memory devices according to embodiments of the present invention, with reference to the drawings.

First Embodiment

Figure 1:
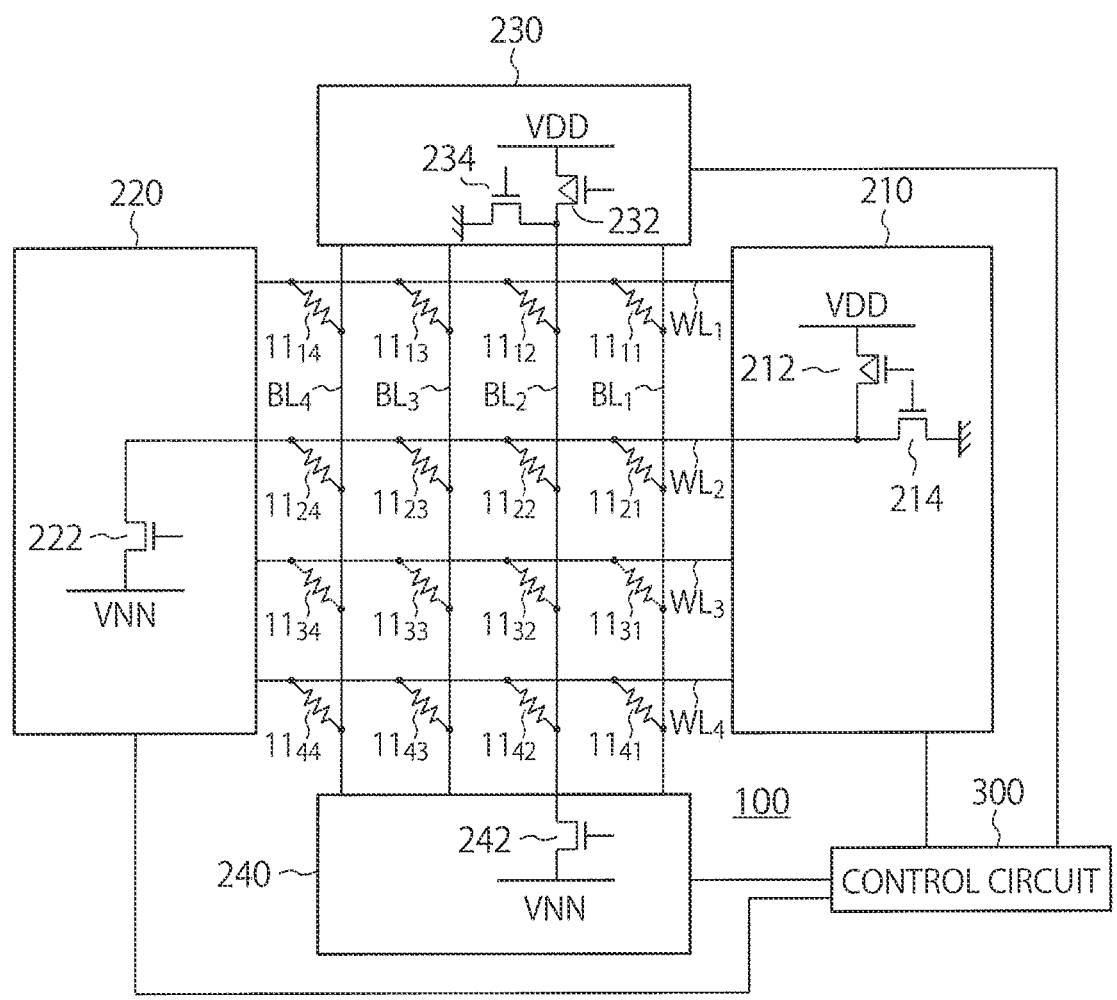
FIG. 1 is a circuit diagram showing a nonvolatile memory device according to a first embodiment.

FIG. 1 shows a nonvolatile memory device (hereinafter also referred to simply as the memory device) according to a first embodiment. The memory device includes a memory cell array 100, drive circuits 210, 220, 230, and 240, and a control circuit 300. The memory cell array 100 includes word lines $WL_1$, $WL_2$, $WL_3$, and $WL_4$, bit lines $BL_1$, $BL_2$, $BL_3$, and $BL_4$ that intersect with these word lines, respectively, and memory cells $11_{ij}$ provided in the intersection regions of the word lines $WL_i$ (i=1, . . . , 4) and the bit lines $BL_j$ (j=1, . . . , 4). A memory cell $11_{ij}$ (i, j=1, . . . , 4) has a first terminal and a second terminal. The first terminal is electrically connected to the corresponding word line $WL_i$, and the second terminal is electrically connected to the corresponding bit line $BL_j$. Note that the memory cell array 100 includes the four word lines $WL_1$ to $WL_4$, the four bit lines $BL_1$ to $BL_4$, and the 4×4 memory cells $11_{11}$ to $11_{44}$ in this embodiment. However, where m and n are natural numbers, the memory cell array 100 may include m word lines $WL_1$ to $WL_m$, n bit lines $BL_1$ to $BL_n$, and mn memory cells $11_{11}$ to $11_{mn}$ provided in the intersection regions thereof.

The word lines $WL_i$ (i=1, . . . , 4) are disposed in a first layer and are arranged to extend in a first direction (x direction), the bit lines $BL_j$ (j=1, . . . , 4) are disposed in a third layer above the first layer and are arranged to extend in a second direction (y direction) intersecting the first direction, and the memory cells $11_{ij}$ (i, j=1, . . . , 4) are disposed in a second layer between the first layer and the third layer and are arranged to extend in a third direction (z direction) intersecting the first direction (x direction) and the second direction (y direction). The drive circuits 210, 220, 230, and 240, and the control circuit 300 are disposed in a layer lower than the first layer in which the word lines $WL_1$ to $WL_4$ are disposed. Note that the drive circuits 210, 220, 230, and 240 are controlled by the control circuit 300.

Figure 2A:
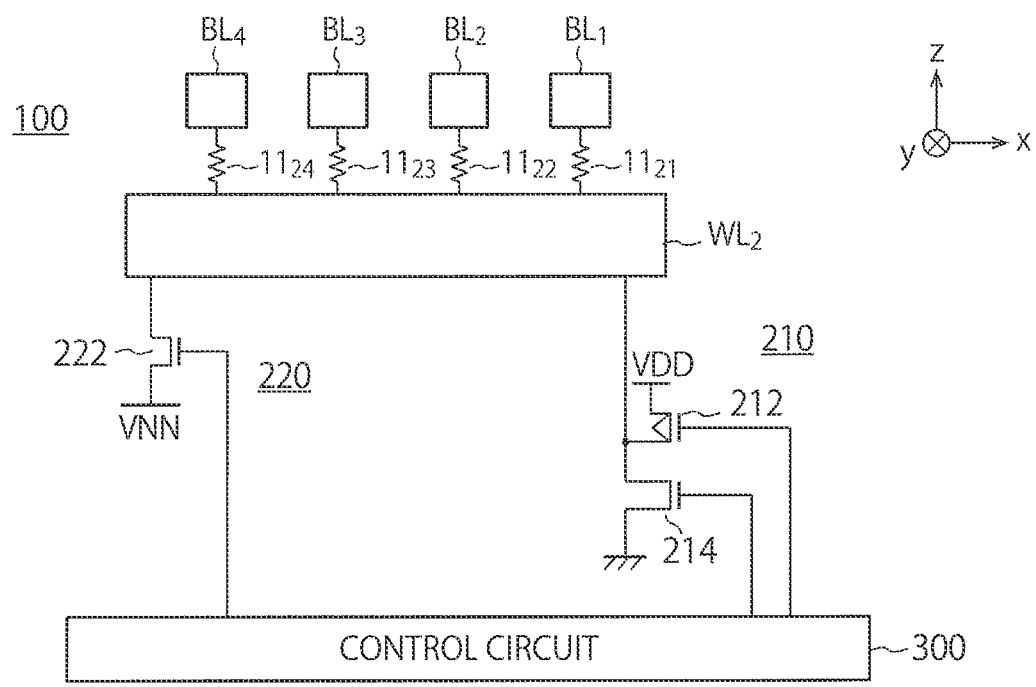
FIG. 2A is a cross-sectional diagram showing the nonvolatile memory device according to the first embodiment.
Figure 2B:
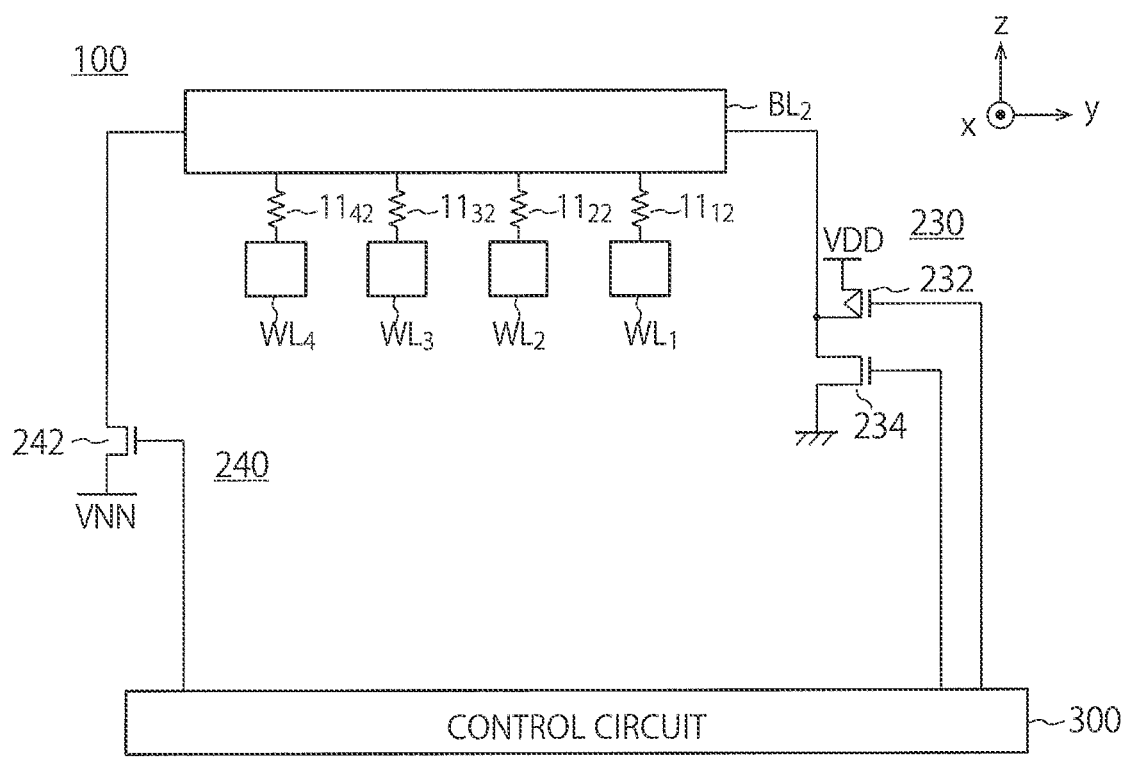
FIG. 2B is a cross-sectional diagram showing the nonvolatile memory device according to the first embodiment.
Figure 2C:
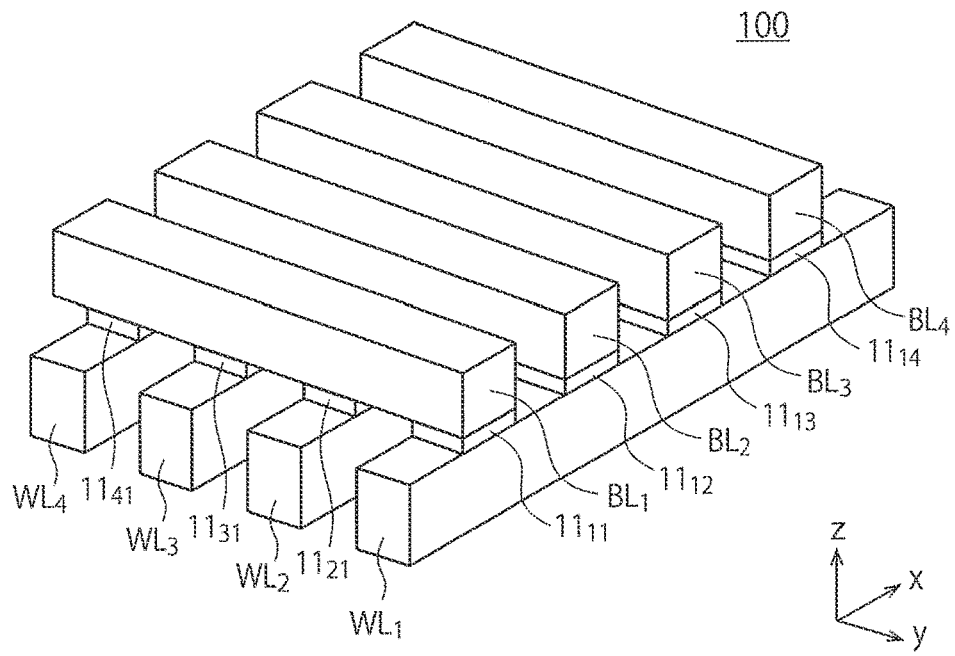
FIG. 2C is a bird's eye view of a memory array according to the first embodiment.

FIG. 2A shows a cross-section of the memory device of the first embodiment, taken along the x-z plane parallel to the word line $WL_2$ shown in FIG. 1. FIG. 2B shows a cross-section, taken along the y-z plane parallel to the bit line $BL_2$. FIG. 2C shows a bird's eye view of the memory cell array 100 of the memory device of the first embodiment. As can be seen from FIGS. 2A to 2C, the memory device of the first embodiment includes an architecture having a three-dimensional structure.

One end of a word line $WL_i$ (i=1, . . . , 4) is electrically connected to the drive circuit 210, and the other end is electrically connected to the drive circuit 220. One end of a bit line $BL_j$ (j=1, . . . , 4) is electrically connected to the drive circuit 230, and the other end is electrically connected to the drive circuit 240. Here, "A is electrically connected to B" means that A may be connected directly to B, or A may be connected indirectly to B via an electric conductor.

The drive circuit 210 includes a p-channel transistor 212 and an n-channel transistor 214 that are provided for each word line $WL_i$ (i=1, . . . , 4) and are connected in series. The source of the p-channel transistor 212 is electrically connected to a power supply that supplies a potential VDD (a positive potential, for example). The source of the n-channel transistor 214 is electrically connected to a power supply (also indicated as VSS) that supplies a potential VSS (0 V, for example). The drain of the p-channel transistor 212 and the drain of the n-channel transistor 214 are electrically connected to one end of the corresponding word line $WL_i$ (i=1, . . . , 4). The gate of the p-channel transistor 212 and the gate of the n-channel transistor 214 receive a control signal from the control circuit 300.

The drive circuit 220 includes an n-channel transistor 222 provided for each word line $WL_i$ (i=1, . . . , 4). The source of the n-channel transistor 222 is electrically connected to a power supply (also indicated as VNN) that supplies a potential VNN (=−VDD), the drain is electrically connected to the other end of the corresponding word line $WL_i$ (i=1, . . . , 4), and the gate receives the control signal from the control circuit 300.

The drive circuit 230 includes a p-channel transistor 232 and an n-channel transistor 234 that are provided for each bit line $BL_j$ (j=1, . . . , 4) and are connected in series. The source of the p-channel transistor 232 is electrically connected to the power supply VDD. The source of the n-channel transistor 234 is electrically connected to the power supply VSS (0 V). The drain of the p-channel transistor 232 and the drain of the n-channel transistor 234 are electrically connected to one end of the corresponding bit line $BL_j$ (j=1, . . . , 4). The gate of the p-channel transistor 232 and the gate of the n-channel transistor 234 receive a signal from the control circuit 300.

The drive circuit 240 includes an n-channel transistor 242 provided for each bit line $BL_j$ (j=1, . . . , 4). The source of the n-channel transistor 242 is electrically connected to the power supply VNN (=−VDD), the drain is electrically connected to the other end of the corresponding bit line $BL_i$ (i=1, . . . , 4), and the gate receives the control signal from the control circuit 300.

Figure 3A:
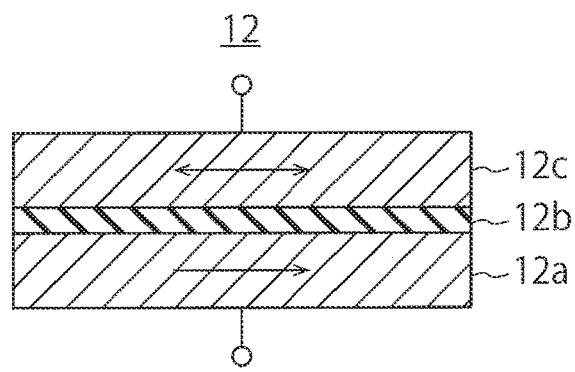
FIG. 3A is a diagram showing the configuration of a memory cell of the nonvolatile memory device according to the first embodiment.
Figure 3B:
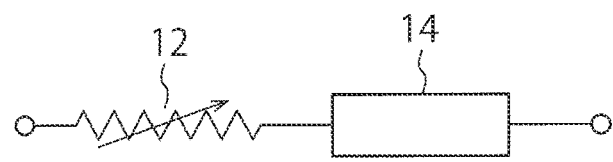
FIG. 3B is a cross-sectional diagram showing a memory element of the nonvolatile memory device according to the first embodiment.

As shown in FIG. 3B, a memory cell $11_{ij}$ (i, j=1, . . . , 4) includes a memory element 12 and a switching element 14 connected in series. The memory element 12 is a variable resistance element that has a first resistance value, and a second resistance value higher than the first resistance value. The memory element 12 is capable of changing its resistance value from one of the first and second resistance values to the other in a case where a write current flows from one of the first and second terminals of the memory cell to the other. For example, in a case where the first resistance value can be changed to the second resistance value when the write current flows from the first terminal to the second terminal, the second resistance value can be changed to the first resistance value when the write current flows from the second terminal to the first terminal.

This variable resistance element is a magnetic tunnel junction (MTJ) element, for example, and includes a magnetic layer (hereinafter also referred to as the reference layer) 12a having a fixed magnetization direction, a magnetic layer (hereinafter also referred to as the memory layer) 12c having a variable magnetization direction, and a non-magnetic insulating layer (hereinafter also referred to as the tunnel barrier layer) 12b provided between the reference layer 12a and the memory layer 12c, as shown in FIG. 3A. Here, "having a fixed magnetization direction" means that the magnetization direction does not change before (before writing) and after (after writing) the write current is applied to the memory element, and "having a variable magnetization direction" means that the magnetization direction can change before and after the write current is applied to the memory element. In a case where the magnetization directions of the reference layer 12a and the memory layer 12c are parallel to each other (the same direction), the resistance value of the MTJ element is low. In a case where the magnetization directions are antiparallel to each other (opposite directions), the resistance value is high.

Although the magnetization directions are orthogonal to the stacking direction of the reference layer and the memory layer, or are parallel to the film plane (surface) in FIG. 3A, the magnetization directions may be directions parallel to the stacking direction, or are directions orthogonal to the film plane. In a case where the magnetization directions are parallel to the stacking direction, the memory layer 12c and the reference layer 12a each have a perpendicular magnetic anisotropy. In a case where the magnetization directions are orthogonal to the stacking direction, the memory layer 12c and the reference layer 12a each have an in-plane magnetic anisotropy.

(Parallel→Anti-Parallel)

A write method to be implemented in a case where the magnetization direction of the memory layer 12c is changed to an antiparallel direction (Anti-Parallel) when it is parallel to the magnetization direction of the reference layer 12a (Parallel) is now described. In this case, the write current flows from the reference layer 12a toward the memory layer 12c via the tunnel barrier layer 12b. Electrons then flow in a direction opposite to the direction of the write current, and flow from the memory layer 12c toward the reference layer 12a. The electrons that are spin-polarized while flowing in the memory layer 12c pass through the tunnel barrier layer 12b, and then reach the interface between the tunnel barrier layer 12b and the reference layer 12a. Most of the spin-polarized electrons have magnetization in the same direction as the magnetization direction of the memory layer 12c, and a few portions have a direction opposite to the magnetization direction of the memory layer 12c. The electrons having magnetization in the same direction as the magnetization direction of the reference layer 12a pass through the above-mentioned interface and flow into the reference layer 12a. On the other hand, the electrons having magnetization in a direction opposite to the magnetization direction of the reference layer 12a are reflected by the above-mentioned interface, flow into the memory layer 12c via the tunnel barrier layer 12b, exert spin torque on the magnetization in the memory layer 12c, and reverse the direction of the magnetization in the memory layer 12c to a direction opposite to the magnetization direction of the reference layer 12a. That is, the magnetization direction of the memory layer 12c becomes antiparallel to the magnetization direction of the reference layer 12a.

(Anti-Parallel→Parallel)

A write method to be implemented in a case where the magnetization direction of the memory layer 12c is changed to a parallel direction (Parallel) when it is antiparallel to the magnetization direction of the reference layer 12a (Anti-Parallel) is now described. In this case, the write current flows from the memory layer 12c toward the reference layer 12a via the tunnel barrier layer 12b. Electrons then flow in a direction opposite to the direction of the write current, and flow from the reference layer 12a toward the memory layer 12c. The electrons that are spin-polarized while flowing in the reference layer 12a pass through the tunnel barrier layer 12b, and then reach the interface between the tunnel barrier layer 12b and the memory layer 12c. Most of the spin-polarized electrons have magnetization in the same direction as the magnetization direction of the reference layer 12a, and a few portions have a direction opposite to the magnetization direction of the reference layer 12a. The electrons having spins in a direction opposite to the magnetization direction of the memory layer 12c flow into the memory layer 12c after passing through the above-mentioned interface, exert spin torque on the magnetization in the memory layer 12c, and reverses the direction of the magnetization in the memory layer 12c to the same direction as the magnetization direction of the reference layer 12a. On the other hand, the electrons having spins in the same direction as the magnetization direction of the memory layer 12c flow into the memory layer 12c. That is, the magnetization direction of the memory layer 12c becomes parallel to the magnetization direction of the reference layer 12a.

Further, in each memory cell $11_{ij}$ (i, j=1, . . . , 4), the switching element 14 connected in series to the memory element 12 has two terminals. One of the two terminals is connected to the corresponding memory element 12 and the other one is connected to the word line. The switching element 14 has functions of a switch that controls supply of current for the corresponding memory element 12 during writing and reading of information (a magnetization direction) to and from the memory element 12. More specifically, in a case where the voltage applied to a certain memory cell $11_{ij}$ (i, j=1, . . . , 4) is lower than a threshold Vth (VDD or higher, for example), the switching element 14 in the memory cell is cut off as an insulator having a large resistance value, and enters an off-state. In a case where the voltage applied to the memory cell is equal to or higher than the threshold Vth, the memory cell is regarded as a conductor having a small resistance value, and a current flows into the memory cell so that the memory cell enters an on-state. That is, the switching element 14 has a function capable of switching between applying the current and blocking the current, depending on the magnitude of the voltage applied to the memory cell $11_{ij}$ (i, j=1, . . . , 4), regardless of the direction of the current flowing therein, (First Example of the Write Method)

Figure 4A:
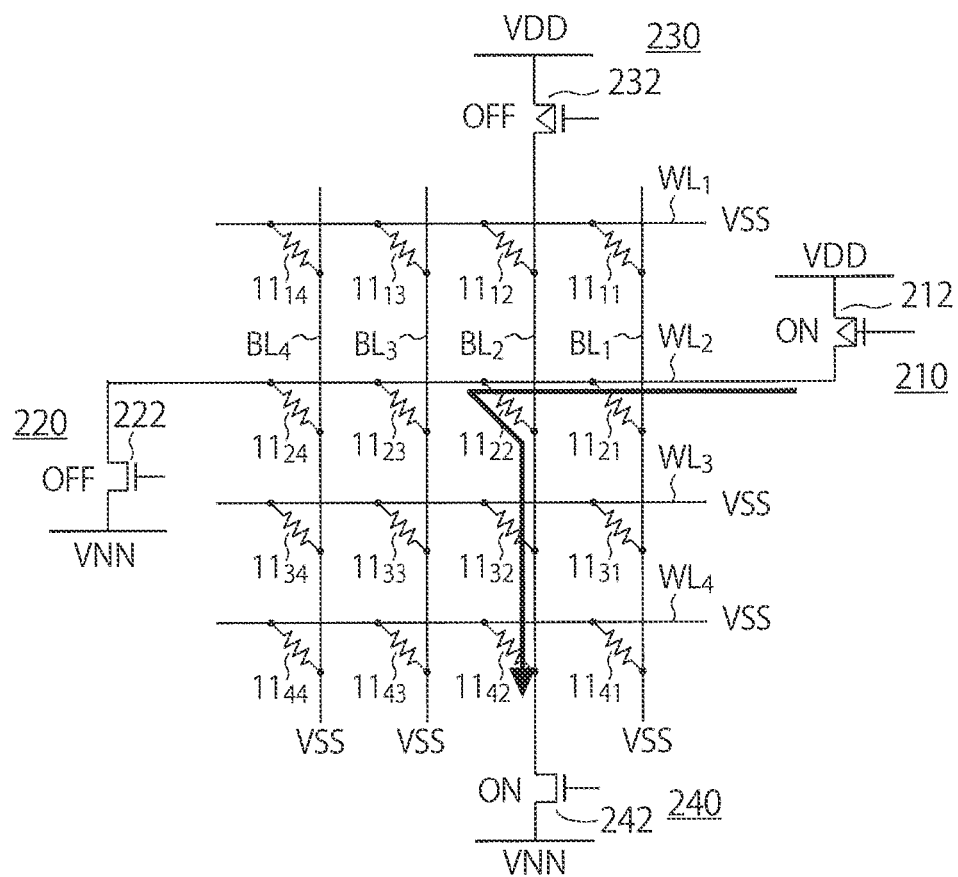
FIGS. 4A and 4B are diagrams for explaining a first example of a write operation of the nonvolatile memory device according to the first embodiment.
Figure 4B:
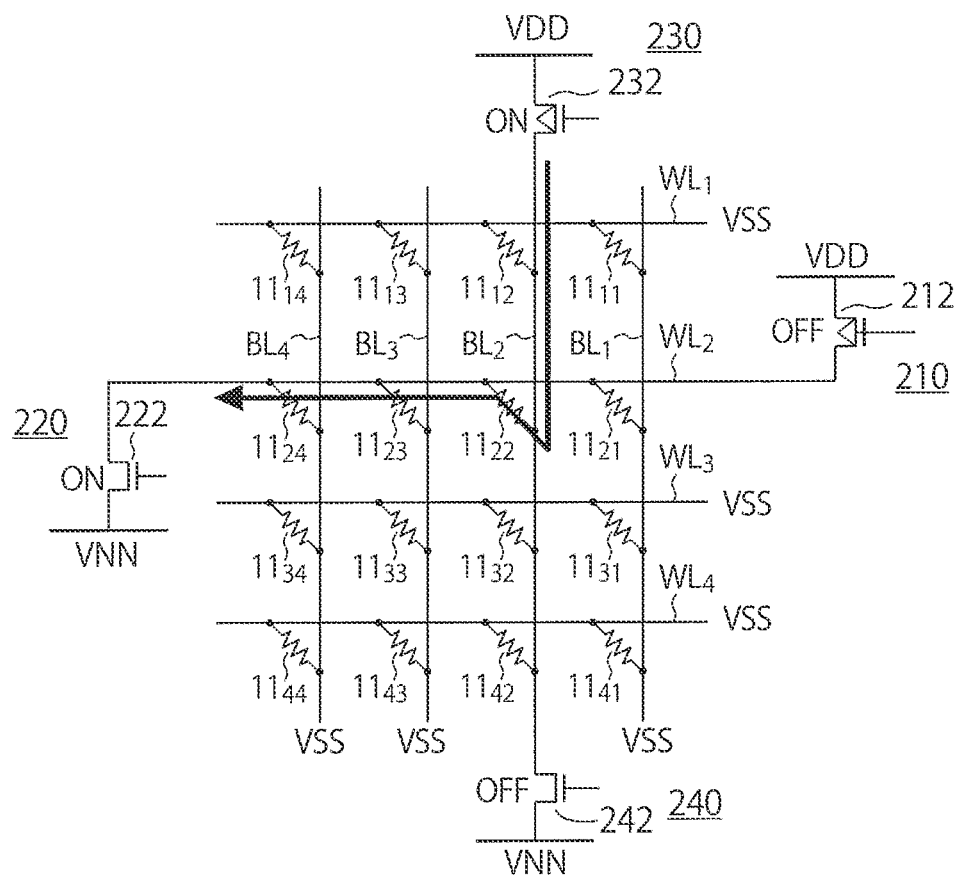

Next, a first example of the write method in the memory device of the first embodiment is described, with reference to FIGS. 4A and 4B. In each memory cell $11_{ij}$ (i, j=1, . . . , 4) in this embodiment, the reference layer 12a is electrically connected to the corresponding word line $WL_i$, and the memory layer 12c is electrically connected to the corresponding bit line $BL_j$. That is, in a case where the reference layer 12a of the memory element 12 is connected directly to the corresponding word line $WL_i$ in each memory cell $11_{ij}$ (i, j=1, 2, 3, 4), the memory layer 12c is electrically connected to the bit line $BL_j$ via the switching element 14. In a case where the reference layer 12a of the memory element 12 is connected to the word line $WL_i$ via the switching element 14, the memory layer 12c is connected directly to the bit line $BL_j$.

FIG. 4A is a diagram for explaining a case where writing is performed so that the magnetization direction of the memory layer 12c of the memory element 12 of the memory cell $11_{22}$ is changed from a direction parallel to the magnetization direction of the reference layer 12a, to a direction antiparallel to the magnetization direction of the reference layer 12a. Note that, in FIG. 4A, the drive circuits 210, 220, 230, and 240 shown in FIG. 1 are not shown, except for the transistors 212, 222, 232, and 242 connected to the word line $WL_2$ and the bit line $BL_2$.

First, the potential VSS is applied to all the word lines $WL_1$ to $WL_4$ and all the bit lines $BL_1$ to $BL_4$, with the use of the drive circuits 210, 220, 230, and 240. It is possible to achieve this by turning off the transistor 212 of the drive circuit 210, the transistor 222 of the drive circuit 220, the transistor 232 of the drive circuit 230, and the transistor 242 of the drive circuit 240, and turning on the transistor 214 of the drive circuit 210 and the transistor 234 of the drive circuit 230.

Next, to write information into the memory element 12 of the memory cell $11_{22}$, the transistor 212 connected to the word line $WL_2$ is turned on, and the transistor 222 is turned off. Further, the transistor 232 connected to the bit line $BL_2$ is turned off, and the transistor 242 is turned on (see FIG. 4A). As a result, the potential VDD is applied to the word line $WL_2$, the potential VNN is applied to the bit line $BL_2$, a write voltage (=VDD−VNN) is applied to the memory element 12 of the memory cell $11_{22}$, and a write current flows from the word line $WL_2$ into the memory cell $11_{22}$ and the bit line $BL_2$. Since the reference layer 12a of the memory cell $11_{22}$ is electrically connected to the word line $WL_2$, and the memory layer 12c is electrically connected to the bit line $BL_2$, the write current flows from the reference layer 12a to the memory layer 12c, and as described above, the magnetization direction of the memory layer 12c is reversed to be a direction opposite (antiparallel) to the magnetization direction of the reference layer 12a.

At this point of time, the voltage VSS is applied to the bit lines $BL_1$, $BL_3$, and $BL_4$ corresponding to the half-selected memory cells $11_{21}$, $11_{23}$, and $11_{24}$ that are connected to the selected word line $WL_2$ having the voltage VDD applied thereto and are not to be subjected to writing. Therefore, a voltage VDD-VSS (=VDD) that is equal to or lower than the threshold Vth of the switching element 14 is applied to the half-selected memory cells $11_{21}$, $11_{23}$, and $11_{24}$, and writing is not performed. That is, erroneous writing can be prevented. Also, the voltage VSS is applied to the word lines $WL_1$, $WL_3$, and $WL_4$ corresponding to the half-selected memory cells $11_{12}$, $11_{32}$, and $11_{42}$ that are connected to the selected bit line $BL_2$ having the voltage VNN applied thereto and are not to be subjected to writing. Therefore, the voltage VDD-VSS (=VDD) equal to or lower than the threshold Vth of the switching element 14 is applied to the half-selected memory cells $11_{12}$, $11_{32}$, and $11_{42}$, and writing is not performed.

FIG. 4B is a diagram for explaining a case where writing is performed so that the magnetization direction of the memory layer 12c of the memory cell $11_{22}$ is changed from a direction antiparallel to the magnetization direction of the reference layer 12a, to a direction parallel to the magnetization direction of the reference layer 12a. Note that, in FIG. 4B, the drive circuits 210, 220, 230, and 240 shown in FIG.

1 are not shown, except for the transistors 212, 222, 232, and 242 connected to the word line $WL_2$ and the bit line $BL_2$.

First, the potential VSS is applied to all the word lines $WL_1$ to $WL_4$ and all the bit lines $BL_1$ to $BL_4$, with the use of the drive circuits 210, 220, 230, and 240. It is possible to achieve this by turning off the transistor 212 of the drive circuit 210, the transistor 222 of the drive circuit 220, the transistor 232 of the drive circuit 230, and the transistor 242 of the drive circuit 240, and turning on the transistor 214 of the drive circuit 210 and the transistor 234 of the drive circuit 230.

Next, to write information into the memory element 12 of the memory cell $11_{22}$, the transistor 212 connected to the word line $WL_2$ is turned off, and the transistor 222 is turned on. Further, the transistor 232 connected to the bit line $BL_2$ is turned on, and the transistor 242 is turned off (see FIG. 4B). As a result, the potential VNN is applied to the word line $WL_2$, the potential VDD is applied to the bit line $BL_2$, a write voltage (=VDD−VNN) is applied to the memory cell $11_{22}$, and a write current flows from the bit line $BL_2$ into the memory cell $11_{22}$ and the word line $WL_2$. Since the reference layer 12a of the memory cell $11_{22}$ is electrically connected to the word line $WL_2$, and the memory layer 12c is electrically connected to the bit line $BL_2$, the write current flows from the memory layer 12c to the reference layer 12a, and as described above, the magnetization direction of the memory layer 12c is reversed to be the same direction as (parallel to) the magnetization direction of the reference layer 12a.

At this point of time, the voltage VSS is applied to the word lines $WL_1$, $WL_3$, and $WL_4$ corresponding to the half-selected memory cells $11_{12}$, $11_{32}$, and $11_{42}$ that are connected to the selected bit line $BL_2$ having the voltage VDD applied thereto and are not to be subjected to writing. Therefore, the voltage VDD-VSS that is equal to or lower than the threshold Vth of the switching element 14 is applied to the half-selected memory cells $11_{21}$, $11_{23}$, and $11_{24}$, and writing is not performed. That is, erroneous writing can be prevented. Also, the voltage VSS is applied to the bit lines $BL_1$, $BL_3$, and $BL_4$ corresponding to the half-selected memory cells $11_{21}$, $11_{23}$, and $11_{24}$ that are connected to the selected word line $WL_2$ having the voltage VNN applied thereto and are not to be subjected to writing. Therefore, the voltage VDD-VSS (VDD, for example) equal to or lower than the threshold Vth of the switching element 14 is applied to the half-selected memory cells $11_{21}$, $11_{23}$, and $11_{24}$, and writing is not performed. That is, erroneous writing can be prevented.

(Second Example of the Write Method)

Figure 5A:
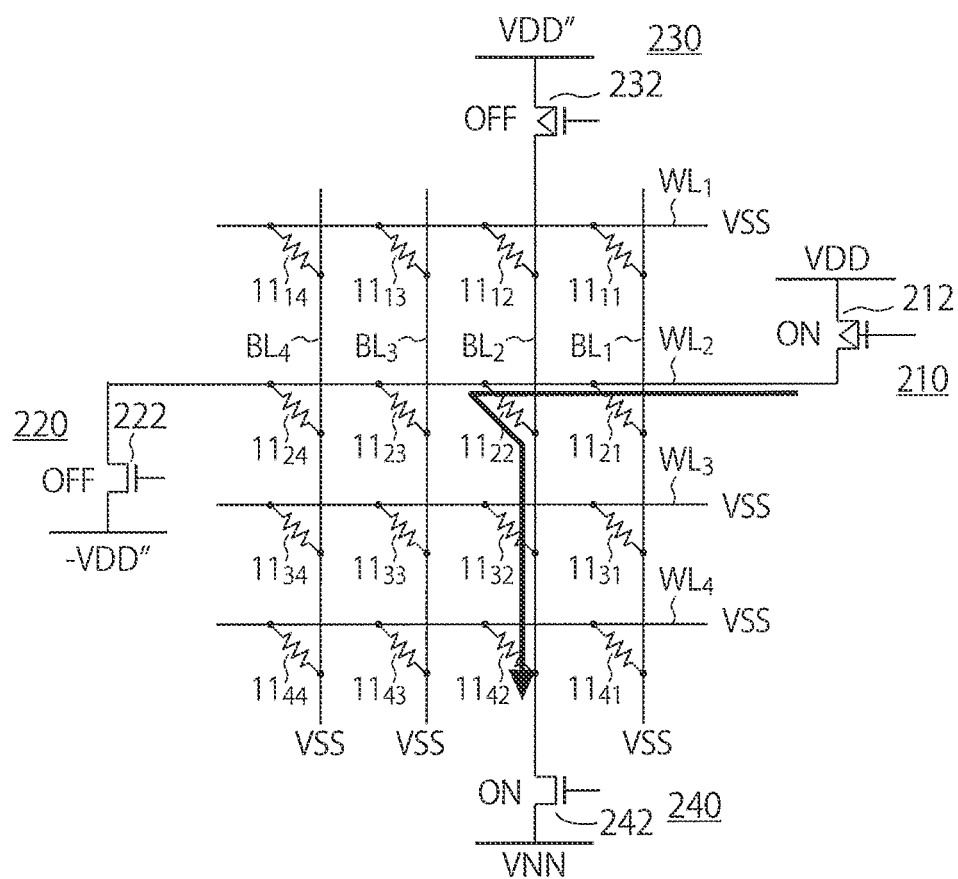
FIGS. 5A and 5B are diagrams for explaining a second example of a write operation of the nonvolatile memory device according to the first embodiment.
Figure 5B:
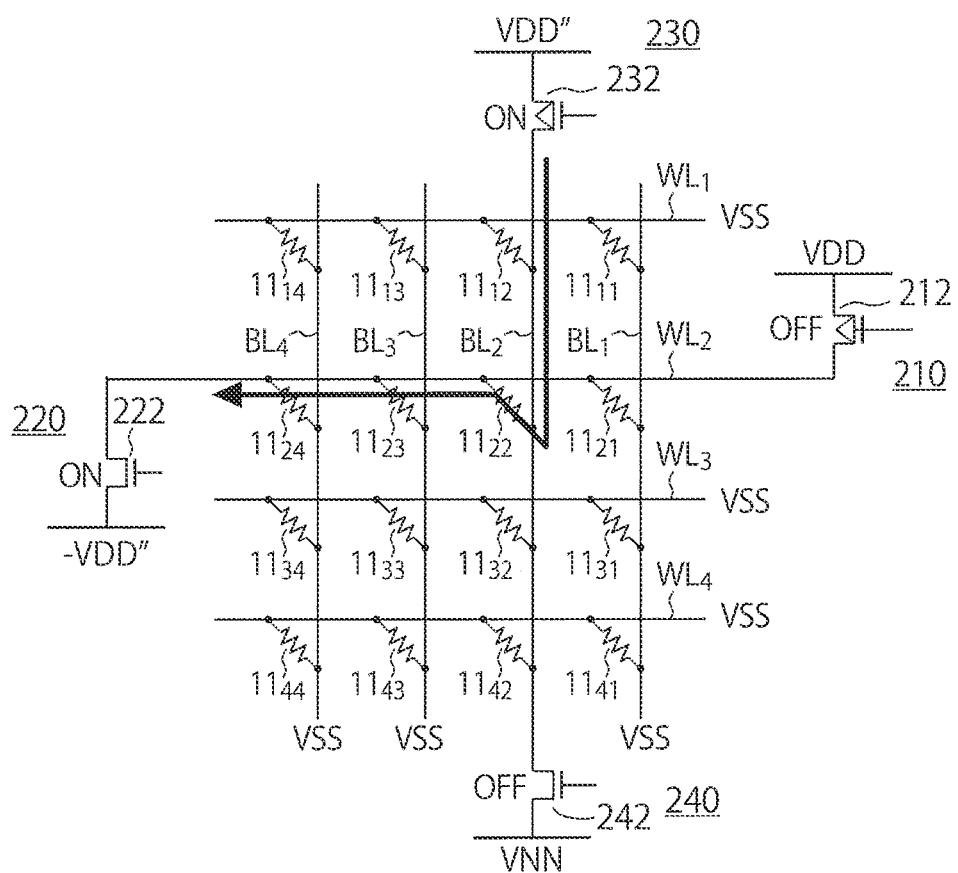

Next, a second example of the write method in the memory device of the first embodiment is described, with reference to FIGS. 5A and 5B. Normally, in a case where the memory element is an MTJ element, when information is written from a parallel direction to an antiparallel direction, a higher voltage is required, compared with the voltage required when information is written from an antiparallel direction to a parallel direction. Therefore, as shown in FIGS. 5A and 5B, in the drive circuit 230 that is used for writing information from an antiparallel direction to a parallel direction, the potential connected to the source of the transistor 232 is changed from VDD to VDD" (=VDD−α, α<VDD). Also, the potential connected to the source of the transistor 222 in the drive circuit 220 is changed from −VDD to −VDD".

As can be seen from FIG. 5A, an operation to write information from a parallel direction to an antiparallel direction is performed in the same manner as in the write operation of the first example shown in FIG. 4A.

In a case where information is written from an antiparallel direction to a parallel direction, writing is performed as shown in FIG. 5B. FIG. 5B is a diagram for explaining a case where writing is performed so that the magnetization direction of the memory layer 12c of the memory cell $11_{22}$ is changed from a direction antiparallel to the magnetization direction of the reference layer 12a, to a direction parallel to the magnetization direction of the reference layer 12a. Note that, in FIG. 5B, the drive circuits 210, 220, 230, and 240 shown in FIG. 1 are not shown, except for the transistors 212, 222, 232, and 242 connected to the word line $WL_2$ and the bit line $BL_2$.

First, the potential VSS is applied to all the word lines $WL_1$ and $WL_4$ all the bit lines $BL_1$ to $BL_4$, with the use of the drive circuits 210, 220, 230, and 240. It is possible to achieve this by turning off the transistor 212 of the drive circuit 210, the transistor 222 of the drive circuit 220, the transistor 232 of the drive circuit 230, and the transistor 242 of the drive circuit 240, and turning on the transistor 214 of the drive circuit 210 and the transistor 234 of the drive circuit 230.

Next, to write information into the memory element 12 of the memory cell $11_{22}$, the transistor 212 connected to the word line $WL_2$ is turned off, and the transistor 222 is turned on. Further, the transistor 232 connected to the bit line $BL_2$ is turned on, and the transistor 242 is turned off (see FIG. 5B). As a result, −VDD" is applied to the word line $WL_2$, −VDD" is applied to the bit line $BL_2$, a write voltage (=VDD"−(−VDD")=VDD"+VDD") is applied to the memory cell $11_{22}$, and a write current flows from the bit line $BL_2$ into the memory cell $11_{22}$ and the word line $WL_2$. Since the reference layer 12a of the memory cell $11_{22}$ is electrically connected to the word line $WL_2$, and the memory layer 12c is electrically connected to the bit line $BL_2$, the write current flows from the memory layer 12c to the reference layer 12a, and as described above, the magnetization direction of the memory layer 12c is reversed to be the same direction as (parallel to) the magnetization direction of the reference layer 12a.

At this point of time, the voltage VSS is applied to the word lines $WL_1$, $WL_3$, and $WL_4$ corresponding to the half-selected memory cells $11_{12}$, $11_{32}$, and $11_{42}$ that are connected to the selected bit line $BL_2$ having VDD" applied thereto and are not to be subjected to writing. Therefore, VDD"−VSS, which is equal to or lower than the threshold Vth of the switching element 14, is applied to the half-selected memory cells $11_{21}$, $11_{23}$, and $11_{24}$, and writing is not performed. That is, erroneous writing can be prevented. Also, the voltage VSS is applied to the bit lines $BL_3$, and $BL_4$ corresponding to the half-selected memory cells $11_{21}$, $11_{23}$, and $11_{24}$ that are connected to the selected word line $WL_2$ having −|VDD applied thereto and are not to be subjected to writing. Therefore, −VDD"−VSS (−VDD", for example), which is equal to or lower than the threshold Vth of the switching element 14, is applied to the half-selected memory cells $11_{21}$, $11_{23}$, and $11_{24}$, and writing is not performed. That is, erroneous writing can be prevented.

(Read Method)

Next, a read method implemented in the memory device is described, with reference to an example case where information is read from the memory element 12 of the memory cell $11_{22}$. In this case, the word line $WL_2$ and the bit line $BL_2$ are selected by the control circuit 300 shown in FIG. 1, a read current is applied from one (the word line $WL_2$, for example) of these selected wiring lines to the other (the bit line $BL_2$, for example), and the voltage between the selected wiring lines is measured to perform reading. This read current has an absolute value smaller than that of the above-mentioned write current, and is large enough to prevent erroneous writing.

As described above, in the first embodiment, the word lines and the bit lines are precharged to the potential VSS prior to a write operation, and thus, stable write operations can be performed.

(Comparative Example)

Figure 6:
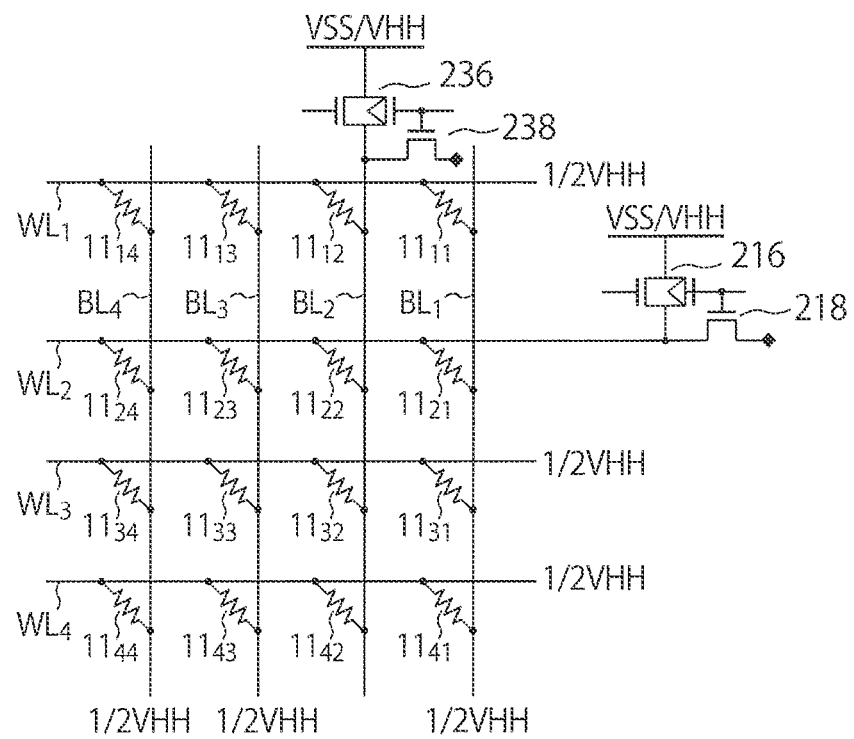
FIG. 6 is a circuit diagram showing a nonvolatile memory device of a comparative example.

Next, a memory device according to a comparative example of the first embodiment is described with reference to FIG. 6. The memory device includes a memory cell array 100 having the same structure as the memory cell array 100 of the memory device shown in FIG. 1. Further, one end of a transfer gate 216 formed with a p-channel transistor and an n-channel transistor, and one of the source and the drain of an n-channel transistor 218 are electrically connected to one end of each word line $WL_i$ (i=1, 2, 3, 4). The other end of the transfer gate 216 is electrically connected to a power supply (hereinafter also referred to as VHH) that supplies a potential VHH (5 V, for example) or a power supply VSS that supplies a potential VSS. The gate of the p-channel transistor of the transfer gate 216 and the gate of the n-channel transistor 218 are electrically connected. The other one of the source and the drain of the n-channel transistor 218 is connected to a power supply that supplies a potential VHH/2.

Meanwhile, one end of a transfer gate 236 formed with a p-channel transistor and an n-channel transistor, and one of the source and the drain of an n-channel transistor 238 are electrically connected to one end of each bit line $BL_j$ (j=1, 2, 3, 4). The other end of the transfer gate 236 is electrically connected to a power supply (hereinafter also referred to as VHH) that supplies the potential VHH (5 V, for example) or a power supply VSS that supplies the potential VSS. The gate of the p-channel transistor of the transfer gate 236 and the gate of the n-channel transistor 238 are electrically connected. The other one of the source and the drain of the n-channel transistor 238 is connected to a power supply that supplies a potential VHH/2.

Next, a method for writing information into the memory device of this comparative example is described. First, the potential VSS is applied to the word lines $WL_1$ to $WL_4$ and the bit lines $BL_1$ to $BL_4$, for information is written. This is performed as described below. The other end of the transfer gate 216 electrically connected to each of the word lines $WL_1$ to $WL_4$ is electrically connected to the power supply VSS, and the transfer gate 216 is turned on. At this point of time, the n-channel transistor 218 is in an off-state. The potential VSS is then applied to all the word lines $WL_1$ to $WL_4$. Also, the other end of the transfer gate 236 electrically connected to each of the bit lines $BL_1$ to $BL_4$ is electrically connected to the power supply VSS, and the transfer gate 236 is turned on. At this point of time, the n-channel transistor 238 is in an off-state. The potential VSS is then applied to all the bit lines $BL_1$ to $BL_4$.

Next, writing is performed to switch the magnetization direction of the memory layer of the memory cell $11_{22}$ from a direction parallel to the magnetization direction of the reference layer to a direction antiparallel to the magnetization direction of the reference layer. In this case, a write current is applied to the word line $WL_2$, the memory cell $11_{22}$, and the bit line $BL_2$, as in the case described with reference to FIG. 4. This is performed as described below. First, the other end of the transfer gate 216 is electrically connected to the power supply VHH, and the transfer gate 216 is turned on. At this point of time, the n-channel transistor 218 having one of its source and drain electrically connected to the word line $WL_2$ is in an off-state. The potential VHH is then applied to the word line $WL_2$. Further, the transfer gate 216 electrically connected to each of the unselected word lines $WL_1$, $WL_3$, and $WL_4$ is turned off, and the n-channel transistor 218 is turned on. The potential VHH/2 is then applied to the unselected word lines $WL_1$, $WL_3$, and $WL_4$ via the n-channel transistor 218.

On the other hand, the other end of the transfer gate 236 is electrically connected to the power supply VSS, and the transfer gate 236 is turned on. At this point of time, the n-channel transistor 238 having one of its source and drain electrically connected to the bit line $BL_2$ is in an off-state. The potential VSS is then applied to the bit line $BL_2$. Further, the transfer gate 236 electrically connected to each of the unselected bit lines $BL_1$, $BL_3$, and $BL_4$ is turned off, and the n-channel transistor 238 is turned on. The potential VHH/2 is then applied to the unselected bit lines $BL_1$, $BL_3$, and $BL_4$ via the n-channel transistor 238.

As described above, the write current flows in the word line $WL_2$, the memory cell $11_{22}$, and the bit line $BL_2$, and writing is performed to switch the magnetization direction of the memory layer of the selected memory cell $11_{22}$ to a direction parallel to the magnetization direction of the reference layer to a direction antiparallel to the magnetization direction of the reference layer, as in the case described with reference to FIG. 4. On the other hand, VHH/2 (=VHH−VHH/2) is applied to the half-selected memory cells $11_{21}$, $11_{23}$, and $11_{24}$, the potential VHH/2 is applied to the half-selected memory cells $11_{12}$, $11_{32}$, and $11_{42}$, and writing is not performed on each of these memory cells.

Next, writing is performed to switch the magnetization direction of the memory layer of the memory cell $11_{22}$ from a direction parallel to the magnetization direction of the reference layer to a direction antiparallel to the magnetization direction of the reference layer. Before this writing is performed, the potential VSS is applied to the word lines $WL_1$ to $WL_4$ and the bit lines $BL_1$ to $BL_4$ as in the case described above. The write current is then applied to the bit line $BL_2$, the memory cell $11_{22}$, and the word line $WL_2$, as in the case described with reference to FIG. 5. This is performed as described below. First, the other end of the transfer gate 236 is electrically connected to the power supply VHH, and the transfer gate 236 is turned on. At this point of time, the n-channel transistor 238 having one of its source and drain electrically connected to the bit line $BL_2$ is in an off-state. The potential VHH is then applied to the bit line $BL_2$. Further, the transfer gate 236 electrically connected to each of the unselected bit lines $BL_1$, $BL_3$, and $BL_4$ is turned off, and the n-channel transistor 238 is turned on. The potential VHH/2 is then applied to the unselected bit lines $BL_1$, $BL_3$, and $BL_4$ via the n-channel transistor 238.

On the other hand, the other end of the transfer gate 216 is electrically connected to the power supply VSS, and the transfer gate 216 is turned on. At this point of time, the n-channel transistor 218 having one of its source and drain electrically connected to the word line $WL_2$ is in an off-state. The potential VSS is then applied to the word line $WL_2$. Further, the transfer gate 216 electrically connected to each of the unselected word lines $WL_1$, $WL_3$, and $WL_4$ is turned off, and the n-channel transistor 218 is turned on. The potential VHH/2 is then applied to the unselected word lines $WL_1$, $WL_3$, and $WL_4$ via the n-channel transistor 218.

As described above, the write current flows in the bit line $BL_2$, the memory cell $11_{22}$, and the word line $WL_2$, and writing is performed to switch the magnetization direction of the memory layer of the selected memory cell $11_{22}$ to a direction antiparallel to the magnetization direction of the reference layer to a direction parallel to the magnetization direction of the reference layer, as in the case described with reference to FIG. 5. On the other hand, VHH/2 (=VHH−VHH/2) is applied to the half-selected memory cells $11_{21}$, $11_{23}$, and $11_{24}$, the potential VHH/2 is applied to the half-selected memory cells $11_{12}$, $11_{32}$, and $11_{42}$, and writing is not performed on each of these memory cells.

As described above, in this comparative example, the transistors constituting the transfer gates 216 and 236 that drive the word lines and the bit lines, and the transistors 218 and 238 are driven at a voltage of 5 V.

In the first embodiment, on the other hand, the transistors 212, 214, 222, 224, 232, 234, 242, and 244 that drive the word lines and the bit lines are driven with VDD. Therefore, in the first embodiment, the size (the channel length, for example) of the transistors of drive circuits can be made smaller than that of the comparative example, and the size of the CUA can be greatly reduced. Also, the drive voltage can be lowered, and power consumption can be reduced.

As described above, according to this embodiment, it is possible to provide a nonvolatile memory device including an architecture having a three-dimensional structure that can be highly integrated.

Although the word lines $WL_1$ to $WL_4$ are disposed below the bit lines $BL_1$ to $BL_4$ in this embodiment, the word lines $WL_1$ to $WL_4$ may be disposed above the bit lines $BL_1$ to $BL_4$.

Further, in this embodiment, a MTJ element is used as a memory element 12. However, the same effects can be achieved with a giant magneto-resistive (GMR) element in which the tunnel barrier layer is replaced with a nonmagnetic metal layer.

Also, a memory element in which a metal oxide is inserted between two electrodes may be used as a memory element 12. In this case, the nonvolatile memory device is a resistive random access memory (ReRAM).

Second Embodiment

A nonvolatile memory device (hereinafter also referred to as the memory device) according to a second embodiment is now described, with reference to FIGS. 7 and 8. The memory device of the second embodiment has a configuration in which a plurality of (four, for example) new word lines are provided in a fifth layer above the bit lines of the memory device of the first embodiment shown in FIGS. 1 to 2C, and memory cells are newly provided between these word lines and the bit lines described above.

Figure 7:
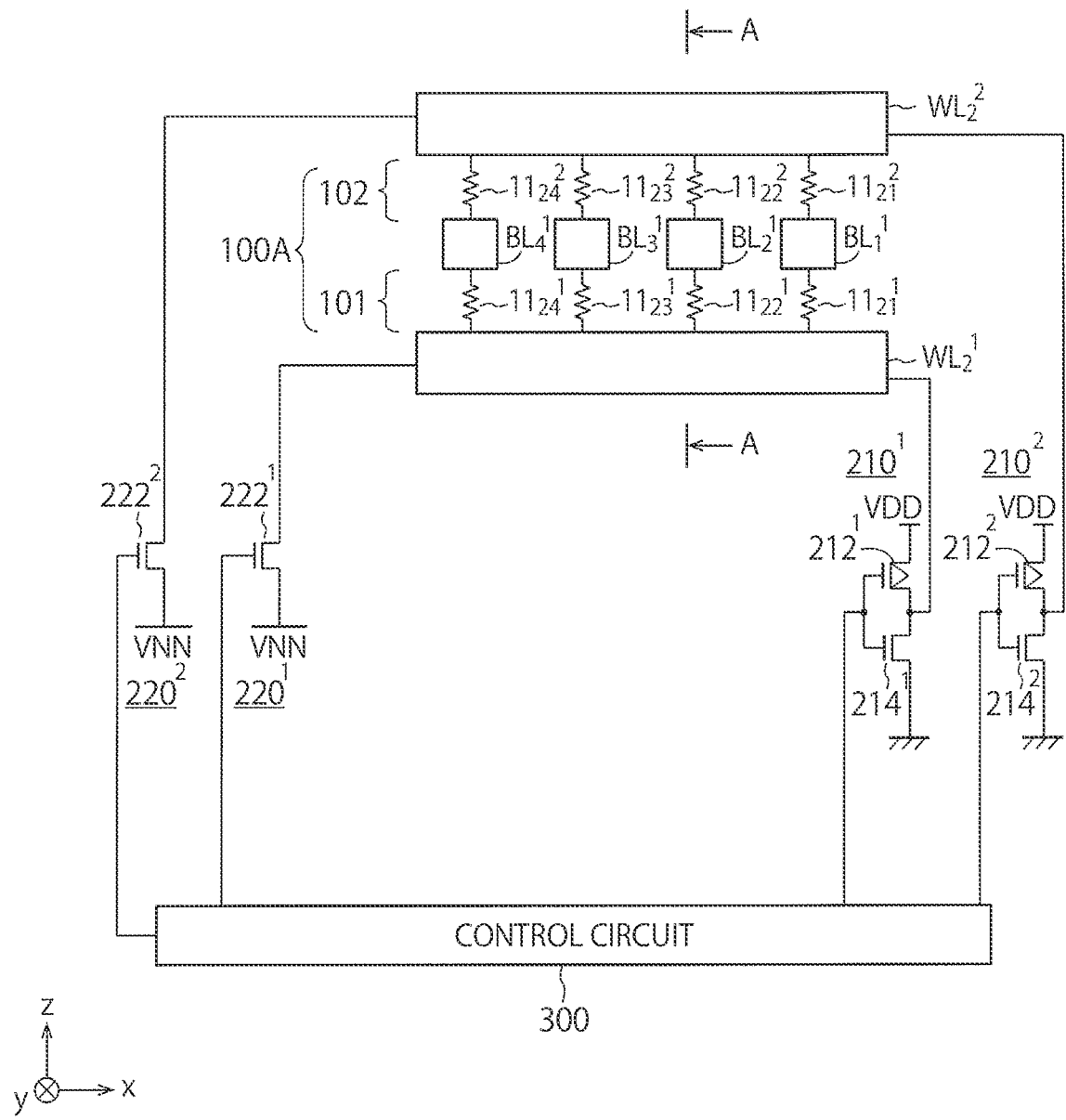
FIG. 7 is a cross-sectional diagram showing a nonvolatile memory device according to a second embodiment.
Figure 8:
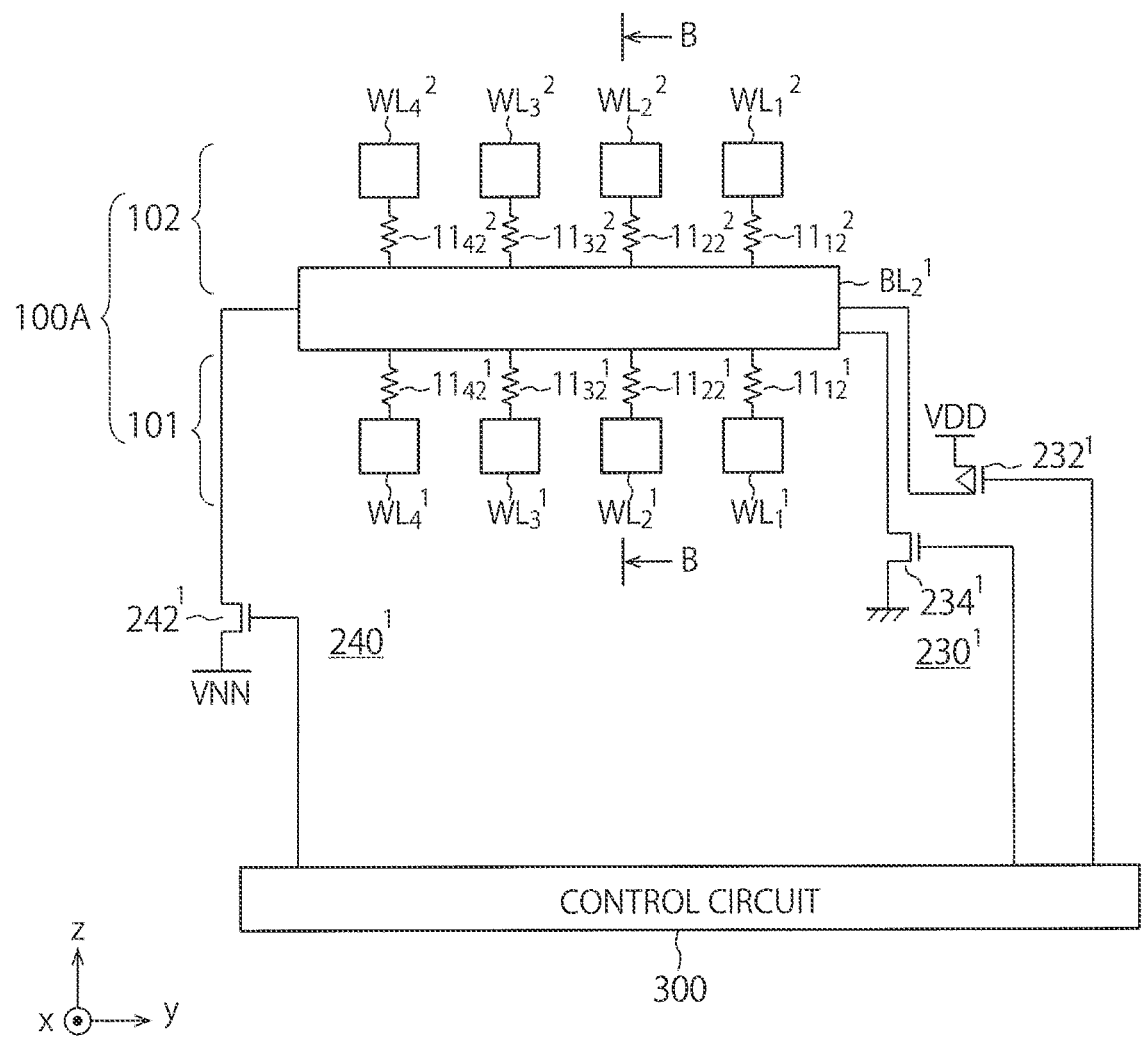
FIG. 8 is a cross-sectional diagram showing the nonvolatile memory device according to the second embodiment.

FIG. 7 is a cross-sectional view of the memory device of the second embodiment, taken along the section plane B-B defined in FIG. 8. FIG. 8 is a cross-sectional view of the memory device of the second embodiment, taken along the section plane A-A defined in FIG. 7. The memory device of the second embodiment includes a memory cell array 100A. The memory cell array 100A includes a first array 101 and a second array 102 provided above the first array 101.

Like the memory cell array 100 of the first embodiment, the first array 101 includes word lines $WL_i^1$ (i=1, ..., 4) that are disposed in the first layer and are arranged to extend in the first direction (x direction), bit lines $B_j^1$ (j=1, ..., 4) that are disposed in the third layer above the first layer and are arranged to extend in the second direction (y direction) intersecting the first direction, and memory cells $11_{ij}^1$ (i, j=1, ..., 4) that are disposed in the second layer between the first layer and the third layer and are arranged to extend in the third direction (z direction) intersecting the first direction (x direction) and the second direction (y direction). The memory cells $11_{ij}^1$ (i, j=1, ..., 4) are provided in the intersection regions between the word lines $WL_i^1$ and the bit lines $BL_j^1$, and each include a first terminal and a second terminal. In a memory cell $11_{ij}^1$ (i, j=1, ..., 4), the first terminal is electrically connected to the corresponding word line $WL_i^1$, and the second terminal is electrically connected to the corresponding bit line $BL_j^1$. Each memory cell $11_{ij}^1$ (i, j=1, ..., 4) has the same structure as the memory cell $11_{ij}$ shown in FIG. 3A. Accordingly, in the memory element 12 forming a memory cell $11_{ij}^1$ (i, j=1, ..., 4), the reference layer 12a is electrically connected to the corresponding word line $WL_i^1$, and the memory layer 12c is electrically connected to the corresponding bit line $BL_j^1$, as in the first embodiment.

The second array 102 includes the bit lines $BL_j^1$ (j=1, ..., 4) that are disposed in the third layer and are arranged to extend in the second direction (y direction), word lines $WL_i^2$ (i=1, ..., 4) that are disposed in the fifth layer above the third layer and are arranged to extend in the first direction (x direction), and memory cells $11_{ij}^2$ (i, j=1, ..., 4) that are disposed in the fourth layer between the third layer and the fifth layer and are arranged to extend in the third direction (z direction). That is, the first array 101 and the second array 102 share the bit lines $BL_j^1$ (j=1, ..., 4) that are disposed in the third layer and are arranged to extend in the second direction (y direction). The memory cells $11_{ij}^2$ (i, j=1, ..., 4) are provided in the intersection regions between the word lines $WL_i^2$ and the bit lines $BL_j^1$, and each include a first terminal and a second terminal. In a memory cell $11_{ij}^2$ (j=1, ..., 4), the first terminal is electrically connected to the corresponding word line $WL_i^2$, and the second terminal is electrically connected to the corresponding bit line $BL_j^1$. Each memory cell $11_{ij}^2$ (j=1, ..., 4) has the same structure as the memory cell $11_{ij}$ shown in FIG. 3A. Accordingly, in the memory element 12 forming a memory cell $11_{ij}^2$ (i, j=1, ..., 4), the reference layer 12a is electrically connected to the corresponding word line $WL_i^2$, and the memory layer 12c is electrically connected to the corresponding bit line $BL_j^1$, as in the first embodiment.

As shown in FIG. 7, the memory device of the second embodiment is provided with: a drive circuit $210^1$ including a p-channel transistor $212^1$ and an n-channel transistor $214^1$ that are electrically connected to one end of each word line $WL_i^1$ (i=1, ..., 4) of the first array 101 and are connected in series; and a drive circuit $220^1$ including an n-channel transistor $222^1$ electrically connected to the other end. Note that, in this embodiment, in the drive circuit $210^1$, the p-channel transistor $212^1$ and the n-channel transistor $214^1$ have a gate connected thereto in common, and receive a word line selection signal from the control circuit 300 with the gate connected thereto in common. The source of the p-channel transistor $212^1$ is electrically connected to the power supply VDD, and the drain is connected to the drain of the n-channel transistor $214^1$ and is electrically connected to the corresponding word line $WL_i^1$ (i=1, ..., 4). The source of the n-channel transistor $214^1$ is electrically connected to the ground power supply VSS, and the drain is electrically connected to the corresponding word line $WL_i^1$ (i=1, ..., 4).

Further, the drain of the n-channel transistor $222^1$ of the drive circuit $220^1$ is electrically connected to the other end of the corresponding word line $WL_i^1$ (i=1, ..., 4), and the source is electrically connected to the power supply VNN.

Meanwhile, the second array 102 is provided with: a drive circuit $210^2$ including a p-channel transistor $212^2$ and an n-channel transistor $214^2$ that are electrically connected to one end of each word line $WL_i^2$ (i=1, ..., 4) and are connected in series; and a drive circuit $220^2$ including an n-channel transistor $222^2$ electrically connected to the other end. Note that, in this embodiment, in the drive circuit $210^2$, the p-channel transistor $212^2$ and the n-channel transistor $214^2$ have a gate connected thereto in common, and receive a word line selection signal from the control circuit 300 with the gate connected thereto in common. The source of the p-channel transistor $212^2$ is electrically connected to the power supply VDD, and the drain is connected to the drain of the n-channel transistor $214^2$ and is electrically connected to the corresponding word line $WL_i^2$ (i=1, ..., 4). The source of the n-channel transistor $214^2$ is electrically connected to the ground power supply VSS, and the drain is electrically connected to the corresponding word line $WL_i^2$ (i=1, ..., 4). The drain of the n-channel transistor $222^2$ of the drive circuit $220^2$ is electrically connected to the other end of the corresponding word line $WL_i^2$ (i=1, ..., 4), and the source is electrically connected to the power supply VNN.

Also, as shown in FIG. 8, the memory device of this embodiment is provided with: a drive circuit $230^1$ including a p-channel transistor $232^1$ that has its drain electrically connected to one end of the bit line $BL_j^1$ (j=1, ..., 4), its source electrically connected to the power supply VDD, and its gate to receive a bit line selection signal from the control circuit 300, and an n-channel transistor $234^1$ that has its drain electrically connected to one end of the bit line $BL_j^1$ (j=1, ..., 4), its source electrically connected to the ground power supply VSS, and its gate to receive a control signal from the control circuit 300; and a drive circuit $240^1$ including an n-channel transistor $242^1$ that has its drain electrically connected to the other end of the bit line $BL_j^1$ (j=1, ..., 4), its source electrically connected to the power supply VNN, and its gate to receive a control signal from the control circuit 300.

Note that the drive circuits $210^1$, $220^1$, $230^1$, $240^1$, $210^2$, $220^2$, $230^2$, and $240^2$, and the control circuit 300 are disposed in a layer lower than the first layer in which the word lines $WL_1^1$ to $WL_4^1$ are disposed.

(Write Operation)

Next, a write operation is described, with reference to an example case where information (a magnetization direction) is written into the memory cell $11_{22}^1$ of the first array 101, for example. First, prior to information writing, the potential VSS is applied to all the word lines $WL_1^1$ to $WL_4^1$ and all the bit lines $BL_1^1$ to $BL_4^1$, to perform a precharge operation. This can be performed by turning off transistor $222^1$ of the drive circuit $220^1$, and setting the word line selection signal for the drive circuit $210^1$ at the H (high) level. At this point of time, the precharge operation may or may not be performed in the second array.

Information is then written into the memory element 12 of the memory cell $11_{22}^1$ in the same manner as in the case described in the first embodiment. As shown in FIG. 4 or 5, for example, a potential is supplied to each of the word lines $WL_2^1$ and the bit line $BL_2^1$ connected to the selected memory cell $11_{22}^1$, and the potential VSS is supplied to the word lines other than the word line $WL_2^1$ and the bit lines other than the bit line $BL_2^1$. As a result, the voltage to be applied between the first terminal and the second terminal of the selected memory cell $11_{22}^1$ is set at VDD-VNN, and the voltage to be applied between the first terminal and the second terminal of each unselected memory cell is set at (VDD-VNN)/2 or 0 V.

In a case where information is written into a selected memory cell in the second array 102, the same operation is performed.

Note that reading of information from a selected memory cell in the first array 101 or the second array 102 is performed in the same manner as in the case described in the first embodiment.

As described above, according to the second embodiment, the size (the channel length, for example) of the transistors of drive circuits can be made smaller, and the size of the CUA can be greatly reduced, as in the first embodiment. Also, the drive voltage can be lowered, and power consumption can be reduced. Thus, according to the second embodiment, it is possible to provide a nonvolatile memory device having an architecture including a three-dimensional structure that can be highly integrated.

In the second embodiment, the memory device may have a structure in which a plurality of new bit lines is disposed so as to extend in the y direction in a layer above the layer in which the word lines $WL_1^2$ to $WL_4^2$ are disposed, and memory cells are newly disposed in the intersection regions between these new bit lines and the word lines $WL_1^2$ to $WL_2^2$, which is a structure having a third array above the second array. Further, in a case where m is an integer of 4 or greater, the memory device may have a structure including first to mth arrays.

Third Embodiment

Figure 9:
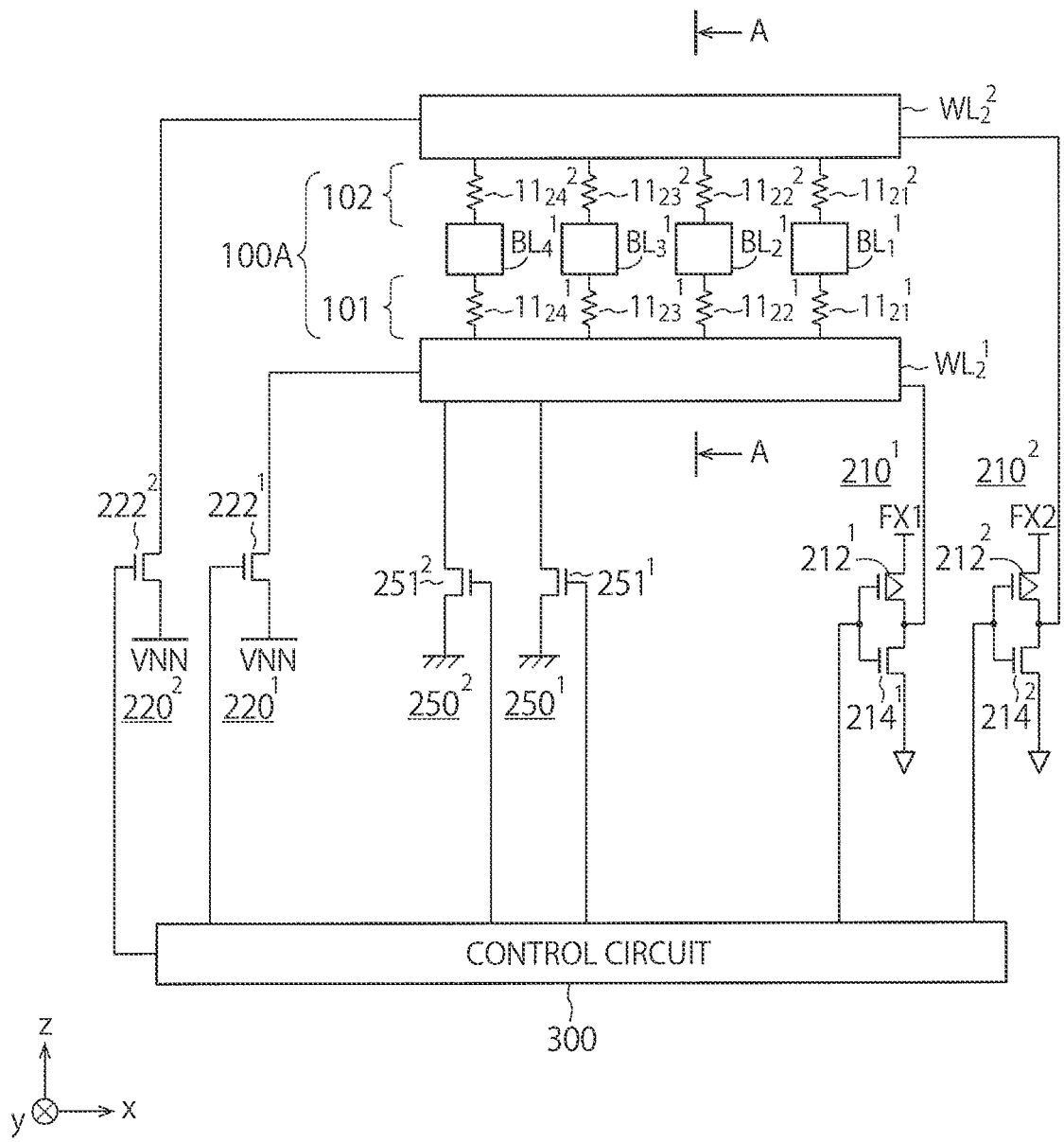
FIG. 9 is a cross-sectional diagram showing a nonvolatile memory device according to a third embodiment.
Figure 10:
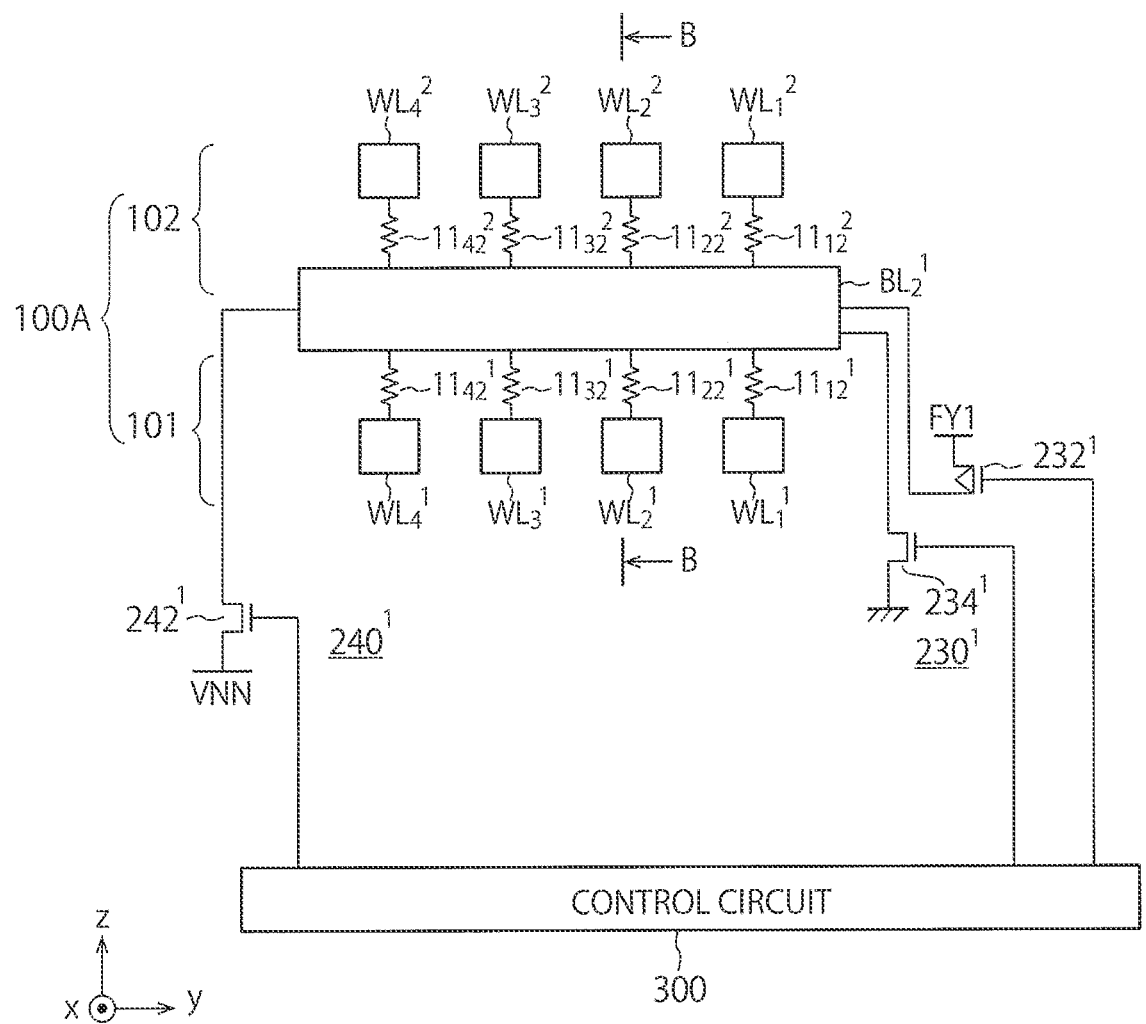
FIG. 10 is a cross-sectional diagram showing the nonvolatile memory device according to the third embodiment.

A nonvolatile memory device (hereinafter also referred to as the memory device) according to a third embodiment is now described, with reference to FIGS. 9 and 10, FIG. 9 is a cross-sectional view of the memory device of the third embodiment, taken along the section plane B-B defined in FIG. 10. FIG. 10 is a cross-sectional view of the memory device of the third embodiment, taken along the section plane A-A defined in FIG. 9.

The memory device of the third embodiment has the same configuration as the memory device of the second embodiment shown in FIGS. 7 and 8, except for further including a drive circuit $250^1$ having an n-channel transistor $251^1$ for each word line $WL_i^1$ (i=1, ..., 4), and a drive circuit $250^2$ having an n-channel transistor $251^2$ for each word line $WL_i^1$ (i=1, ..., 4). The drain of the n-channel transistor $251^1$ is electrically connected to the other end of the corresponding word line $WL_i^1$ (i=1, ..., 4), the drain is electrically connected to the power supply VSS, and the gate is to receive a control signal from the control circuit 300. The drain of the n-channel transistor $251^2$ is electrically connected to the other end of the corresponding word line $W_i^2$ (i=1, ..., 4), the drain is electrically connected to the power supply VSS, and the gate is to receive the control signal from the control circuit 300.

Note that the drive circuits $210^1$, $220^1$, $230^1$, $240^1$, $250^1$, $210^2$, $220^2$, $230^2$, $240^2$, and $250^2$, and the control circuit 300 are disposed in a layer lower than the first layer in which the word lines $WL_1^1$ to $WL_4^1$ are disposed.

Further, in the memory device of the third embodiment, the same word line selection signal is input to the drive circuit $210^1$ and the drive circuit $210^2$, the source of the p-channel transistor $212^1$ of the drive circuit $210^1$ is electrically connected to a power supply FX1, the source of the p-channel transistor $212^2$ of the drive circuit $210^2$ is electrically connected to a power supply FX2, and the source of the p-channel transistor $222^1$ of the drive circuit $220^1$ is electrically connected to a power supply FY1. Each of the power supplies FX1, FX2, and FY1 has the value of VDD or VSS. This is described below through an example write operation.

(Write Operation)

In a case where information is to be written into the memory cell $11_{22}{}^1$ of the first array 101, the potential VSS is supplied to all the word lines $WL_1{}^1$ to $WL_4{}^1$ of the first array 101, and the potential VSS is supplied to all the bit lines $BL_1{}^1$ to $BL_4{}^1$, to perform precharging first. This can be accomplished by turning on the n-channel transistor $251^1$ of the drive circuit $250^1$ and the n-channel transistor $234^1$ of the drive circuit $230^1$.

At this point of time, the precharge operation may or may not be performed in the second array.

Information is then written into the memory element 12 of the memory cell $11_{22}{}^1$ in the same manner as in the case described in the first embodiment. As shown in FIG. 4 or 5, for example, a potential is supplied to each of the word lines $WL_2{}^1$ and the bit line $BL_2{}^1$ connected to the selected memory cell $11_{22}{}^1$, and the potential VSS is supplied to the word lines other than the word line $WL_2{}^1$ and the bit lines other than the bit line $BL_2{}^1$. At this point of time, in a case where the potential VDD is supplied to the word line $WL_2{}^1$, the power supply FX1 is set to the power supply VDD, as shown in FIG. 4, for example, the power supply FX2 is set to the power supply VSS, and a word line control signal for the drive circuit $210^1$ and the drive circuit $210^2$ is set at the L (low) level. In this case, the p-channel transistor $212^2$ of the drive circuit $210^2$ enters an on-state, and the word line $WL_2{}^2$ enters a floating state. Therefore, the n-channel transistor $251^2$ of the drive circuit $250^2$ is turned on, to supply the potential VSS to the word line $WL_2{}^2$.

As a result, the voltage to be applied between the first terminal and the second terminal of the selected memory cell $11_{22}{}^1$ is set at VDD-VNN, and the voltage to be applied between the first terminal and the second terminal of each unselected memory cell is set at (VDD-VNN)/2 or 0 V.

Note that, in the third embodiment, the power supply FY1 is fixed to VDD. However, the memory device may have a structure in which a plurality of new bit lines is disposed so as to extend in the y direction in a layer above the layer in which the word lines $WL_1{}^2$ to $WL_4{}^2$ are disposed, and memory cells are newly disposed in the intersection regions between these new bit lines and the word lines $WL_1{}^2$ to $WL_4{}^2$, which is a structure having a third array above the second array. In this case, a power supply FY2 (not shown) is supplied to the plurality of new bit lines, and the power supply FY1 and the power supply FY2 function like the power supply FX1 and the power supply FX2. That is, the power supply FY1 and the power supply FY2 have the value of the potential VDD or the potential VSS.

In a case where information is written into a selected memory cell in the second array 102, the same operation is performed.

Note that reading of information from a selected memory cell in the first array 101 or the second array 102 is performed in the same manner as in the case described in the first embodiment.

As described above, according to the third embodiment, the size (the channel length, for example) of the transistors of drive circuits can be made smaller, and the size of the CUA can be greatly reduced, as in the first embodiment. Also, the drive voltage can be lowered, and power consumption can be reduced. Thus, according to the third embodiment, it is possible to provide a nonvolatile memory device including an architecture having a three-dimensional structure that can be highly integrated.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. A nonvolatile memory device comprising:
    a first wiring line that is disposed in a first layer and extends in a first direction;
    a second wiring line that is disposed in a second layer above the first layer and extends in a second direction intersecting the first direction;
    a memory cell that is disposed in a third layer located between the first layer and the second layer, and has a first terminal electrically connected to the first wiring line and a second terminal electrically connected to the second wiring line, the memory cell including a variable resistance element having a resistance that varies when a write current flows from one of the first terminal and the second terminal to the other;
    a first drive circuit that is electrically connected to one end of the first wiring line, and is capable of supplying a first potential and a second potential lower than the first potential;
    a second drive circuit that is electrically connected to the other end of the first wiring line, and supplies a third potential having a different polarity from a polarity of the first potential;
    a third drive circuit that is electrically connected to one end of the second wiring line, and is capable of supplying the second potential and a fourth potential higher than the second potential;
    a fourth drive circuit that is electrically connected to the other end of the second wiring line, and supplies a fifth potential having a different polarity from a polarity of the first potential; and
    a control circuit that is electrically connected to the first to fourth drive circuits.

2. The nonvolatile memory device according to claim 1, wherein the second potential is an average value of the first potential and the third potential.

3. The nonvolatile memory device according to claim wherein the memory cell further includes a switching element that is connected in series to the variable resistance element between the first terminal and the second terminal, and controls supply of current for the variable resistance element.

4. The nonvolatile memory device according to claim wherein
    the first drive circuit includes: a first p-channel transistor that has a drain electrically connected to the one end of the first wiring line, a source electrically connected to a first power supply that supplies the first potential, and a gate to receive a control signal from the control circuit; and a first n-channel transistor that has a drain electrically connected to the one end of the first wiring line, a source electrically connected to a second power supply that supplies the second potential, and a gate to receive a control signal from the control circuit,
    the second drive circuit includes a second n-channel transistor that has a drain electrically connected to the other end of the first wiring line, a source electrically connected to a third power supply that supplies the third potential, and a gate to receive a control signal from the control circuit, the third drive circuit includes: a second p-channel transistor that has a drain electrically connected to the one end of the second wiring line, a source electrically connected to a fourth power supply that supplies the fourth potential, and a gate to receive a control signal from the control circuit; and a third n-channel transistor that has a drain electrically connected to the one end of the second wiring line, a source electrically connected to the second power supply, and a gate to receive a control signal from the control circuit, and the fourth drive circuit includes a fourth n-channel transistor that has a drain electrically connected to the other end of the second wiring line, a source electrically connected to a fifth power supply that supplies the fifth potential, and a gate to receive a control signal from the control circuit.

5. The nonvolatile memory device according to claim wherein when a current is caused to flow from the first wiring line to the second wiring line via the memory cell to write information into the variable resistance element, the control circuit causes the first drive circuit to supply the first potential to the first wiring line, and causes the fourth drive circuit to supply the fifth potential to the second wiring line, and, when a current is caused to flow from the second wiring line to the first wiring line via the memory cell to write information into the variable resistance element, the control circuit causes the third drive circuit to supply the fourth potential to the second wiring line, and causes the second drive circuit to supply the third potential to the first wiring line.

6. The nonvolatile memory device according to claim 1, wherein, before information is written into the variable resistance element, the control circuit causes the first drive circuit to supply the second potential to the first wiring line, and causes the third drive circuit to supply the second potential to the second wiring line.

7. The nonvolatile memory device according to claim 1, wherein the variable resistance element includes a first magnetic layer having a fixed magnetization direction, a second magnetic layer having a variable magnetization direction, and a nonmagnetic insulating layer disposed between the first magnetic layer and the second magnetic layer.

8. A nonvolatile memory device comprising:
a plurality of first wiring lines that are disposed in a first layer and are arranged to extend in a first direction;
a plurality of second wiring lines that are disposed in a second layer above the first layer, and are arranged to extend in a second direction intersecting the first direction;
a plurality of first memory cells that are disposed in a third layer between the first layer and the second layer, and are disposed in intersection regions between the plurality of first wiring lines and the plurality of second wiring lines, each first memory cell of the plurality of first memory cells including a first terminal and a second terminal, the first terminal being electrically connected to a corresponding first wiring line, the second terminal being electrically connected to a corresponding second wiring line, each first memory cell of the plurality of first memory cells including a first variable resistance element having a resistance that varies when a write current flows from one of the first terminal and the second terminal to the other;

a first drive circuit that is electrically connected to one end of the plurality of first wiring lines, and is capable of supplying a first potential and a second potential lower than the first potential;

a second drive circuit that is electrically connected to the other end of the plurality of first wiring lines, and supplies a third potential having a different polarity from a polarity of the first potential;

a third drive circuit that is electrically connected to one end of the plurality of second wiring lines, and is capable of supplying the second potential and a fourth potential higher than the second potential;

a fourth drive circuit that is electrically connected to the other end of the plurality of second wirings, and supplies a fifth potential having a different polarity from a polarity of the first potential; and a control circuit that is electrically connected to the first to fourth drive circuits.

9. The nonvolatile memory device according to claim 8, wherein the second potential is an average value of the first potential and the third potential.

10. The nonvolatile memory device according to claim 8, wherein each first memory cell of the plurality of first memory cells further includes a first switching element that is connected in series to the first variable resistance element between the first terminal and the second terminal, and controls supply of current for the first variable resistance element.

11. The nonvolatile memory device according to claim 8, wherein the first drive circuit is provided for the plurality of first wiring lines, and includes: a first p-channel transistor that has a drain electrically connected to the one end of a corresponding first wiring line, a source electrically connected to a first power supply that supplies the first potential, and a gate to receive a control signal from the control circuit; and a first n-channel transistor that has a drain electrically connected to the one end of a corresponding first wiring line, a source electrically connected to a second power supply that supplies the second potential, and a gate to receive a control signal from the control circuit, the second drive circuit is provided for the plurality of first wiring lines, and includes a second n-channel transistor that has a drain electrically connected to the other end of a corresponding first wiring line, a source electrically connected to a third power supply that supplies the third potential, and a gate to receive a control signal from the control circuit, the third drive circuit is provided for the plurality of second wiring lines, and includes: a second p-channel transistor that has a drain electrically connected to the one end of a corresponding second wiring line, a source electrically connected to a fourth power supply that supplies the fourth potential, and a gate to receive a control signal from the control circuit; and a third n-channel transistor that has a drain electrically connected to the one end of a corresponding second wiring line, a source electrically connected to the second power supply, and a gate to receive a control signal from the control circuit, and the fourth drive circuit is provided for the plurality of second wiring lines, and includes a fourth n-channel transistor that has a drain electrically connected to the other end of a corresponding second wiring line, a source electrically connected to a fifth power supply that supplies the fifth potential, and a gate to receive a control signal from the control circuit.

12. The nonvolatile memory device according to claim 8, wherein,
when one memory cell of the plurality of first memory cells is selected, and information is to be written into the first variable resistance element of the selected memory cell,
to write information into the first variable resistance element by applying a current to a corresponding second wiring line via the selected memory cell from the first wiring line corresponding to the selected memory cell, the control circuit causes the first drive circuit to supply the first potential to the first wiring line corresponding to the selected memory cell, and causes the fourth drive circuit to supply the fifth potential to the second wiring line corresponding to the selected memory cell,
to write information into the first variable resistance element by applying a current to a corresponding first wiring line via the selected memory cell from the second wiring line corresponding to the selected memory cell, the control circuit causes the third drive circuit to supply the fourth potential to the second wiring line corresponding to the selected memory cell, and causes the second drive circuit to supply the third potential to the first wiring line corresponding to the selected memory cell, and
the control circuit causes the first drive circuit to supply the second potential to the first wiring line corresponding to the first memory cell other than the selected memory cell, and causes the third drive circuit to supply the second potential to the second wiring line corresponding to the first memory cell other than the selected memory cell.

13. The nonvolatile memory device according to claim 12, wherein the control circuit causes the first drive circuit to supply the second potential to the first wiring line corresponding to the first memory cell other than the selected memory cell, and causes the third drive circuit to supply the second potential to the second wiring line corresponding to the first memory cell other than the selected memory cell.

14. The nonvolatile memory device according to claim 12, wherein, before information is written into the first variable resistance element of the selected memory cell, the control circuit causes the first drive circuit to supply the second potential to the plurality of first wiring lines, and causes the third drive circuit to supply the second potential to the plurality of second wiring lines.

15. The nonvolatile memory device according to claim 8, wherein the first variable resistance element includes a first magnetic layer having a fixed magnetization direction, a second magnetic layer having a variable magnetization direction, and a first nonmagnetic insulating layer disposed between the first magnetic layer and the second magnetic layer.

16. The nonvolatile memory device according to claim 8, further comprising:
a plurality of third wiring lines that are disposed in a fourth layer above the second layer, and are arranged to extend in the first direction;
a plurality of second memory cells that are disposed in a fifth layer between the second layer and the fourth layer, and are arranged in intersection regions between the plurality of second wiring lines and the plurality of third wiring lines, each second memory cell of the plurality of second memory cells including a third terminal and a fourth terminal, the third terminal being electrically connected to a corresponding third wiring line, the fourth terminal being electrically connected to a corresponding second wiring line, each second memory cell of the plurality of second memory cells including a second variable resistance element having a resistance that varies when a write current flows from one of the third terminal and the fourth terminal to the other;
a fifth drive circuit that is electrically connected to one end of the plurality of third wiring lines and is capable of supplying the first potential and the second potential; and
a sixth drive circuit that is electrically connected to the other end of the plurality of third wiring lines and is capable of supplying the third potential, wherein
the control circuit is electrically connected to the fifth drive circuit and the sixth drive circuit.

17. The nonvolatile memory device according to claim 16, wherein the second memory cell further includes a second switching element that is connected in series to the second variable resistance element between the third terminal and the fourth terminal, and controls supply of current for the second variable resistance element.

18. The nonvolatile memory device according to claim 16, wherein the second variable resistance element includes a third magnetic layer having a fixed magnetization direction, a fourth magnetic layer having a variable magnetization direction, and a second nonmagnetic insulating layer disposed between the third magnetic layer and the fourth magnetic layer.

19. The nonvolatile memory device according to claim 16, wherein
when one memory cell of the plurality of second memory cells is selected, and information is to be written into the second variable resistance element of the selected memory cell,
to write information into the second variable resistance element by applying a current to a corresponding second wiring line via the selected memory cell from the third wiring line corresponding to the selected memory cell, the control circuit causes the fifth drive circuit to supply the first potential to the third wiring line corresponding to the selected memory cell, and causes the fourth drive circuit to supply the fifth potential to the second wiring line corresponding to the selected memory cell, and
to write information into the second variable resistance element by applying a current to a corresponding third wiring line via the selected memory cell from the second wiring line corresponding to the selected memory cell, the control circuit causes the third drive circuit to supply the fourth potential to the second wiring line corresponding to the selected memory cell, and causes the sixth drive circuit to supply the third potential to the third wiring line corresponding to the selected memory cell.

20. The nonvolatile memory device according to claim 19, wherein the control circuit causes the fifth drive circuit to supply the second potential to the third wiring line corresponding to the second memory cell other than the selected memory cell, and causes the third drive circuit to supply the second potential to the second wiring line corresponding to the second memory cell other than the selected memory cell.

21. The nonvolatile memory device according to claim 19, wherein, before information is written into the selected memory cell, the control circuit causes the fifth drive circuit electrically connected to the selected memory cell to supply the second potential to the plurality of third wiring lines, and causes the third drive circuit to supply the second potential to the plurality of second wiring lines.

22. The nonvolatile memory device according to claim 19, further comprising:
- a seventh drive circuit that is electrically connected to the other end of the plurality of first wiring lines, and supplies the second potential; and
- an eighth drive circuit that is electrically connected to the other end of the plurality of third wiring lines, and supplies the second potential, wherein
- the seventh drive circuit and the eighth drive circuit are electrically connected to the control circuit.

23. The nonvolatile memory device according to claim 22, wherein, when information is to be written into one of the first variable resistance element included in the first memory cell and the second variable resistance element included in the second memory cell, the control circuit simultaneously sends the same control signal to the first drive circuit and the fifth drive circuit, and supplies the second potential to one of the first wiring line and the third wiring line that are electrically connected to the other one of the first memory cell and the second memory cell.

* * * * *